(12) United States Patent
Akahane et al.

(10) Patent No.: US 8,566,049 B2
(45) Date of Patent: Oct. 22, 2013

(54) BATTERY SYSTEM

(75) Inventors: Fumihiro Akahane, Tokyo (JP);
Toshimichi Tsumaki, Tokyo (JP);
Takumi Oya, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 437 days.

(21) Appl. No.: 12/882,704

(22) Filed: Sep. 15, 2010

(65) Prior Publication Data

US 2011/0071781 A1    Mar. 24, 2011

(30) Foreign Application Priority Data

Sep. 18, 2009    (JP) .................. 2009-216956

(51) Int. Cl.
*G06F 11/30*    (2006.01)
*G06F 17/40*    (2006.01)
*G01R 19/00*    (2006.01)

(52) U.S. Cl.
USPC ............ 702/63; 73/1.01; 73/865.8; 73/865.9; 320/134; 340/636.1; 340/636.12; 340/636.15; 340/636.19; 702/34; 702/108; 702/182; 702/187; 702/189; 708/200

(58) Field of Classification Search
USPC ........ 73/432.1, 865.8, 865.9, 866.3; 320/127, 320/128, 134; 324/72, 76.11; 340/500, 540, 340/635, 636.1, 636.12, 636.15, 636.19; 702/1, 33, 34, 57, 60, 61, 63, 64, 65, 702/127, 182, 187, 188, 189; 708/100, 105, 708/200
IPC ............ G01R 19/00,29/00; G06F 11/00, 11/30, G06F 11/32, 17/00, 17/40, 19/00
See application file for complete search history.

(56) References Cited

U.S. PATENT DOCUMENTS

| | | | |
|---|---|---|---|
| 5,115,182 A * | 5/1992 | Ehmke et al. .................. | 320/136 |
| 5,783,998 A * | 7/1998 | Nakajou et al. .......... | 340/636.15 |
| 6,094,053 A | 7/2000 | Harvey | |
| 6,104,967 A * | 8/2000 | Hagen et al. .................. | 700/293 |
| 6,404,166 B1 | 6/2002 | Puchianu | |

(Continued)

FOREIGN PATENT DOCUMENTS

| EP | 2007077 A1 | 12/2008 |
|---|---|---|
| EP | 2299518 A2 * | 3/2011 |

(Continued)

OTHER PUBLICATIONS

European Search Report dated Sep. 28, 2011, issued in corresponding European Patent Application No. 10176788.7.

(Continued)

*Primary Examiner* — Edward Cosimano
(74) *Attorney, Agent, or Firm* — Westerman, Hattori, Daniels & Adrian, LLP

(57) ABSTRACT

A battery system comprises a first battery cell and a first management unit which is connected in one-to-one correspondence to the first battery cell. The first management unit comprises a first parameter acquiring unit, a first calculating unit, and a first storage unit. The first parameter acquiring unit acquires a power consumption parameter of the first battery cell. The first calculating unit calculates a power consumption state value of the first battery cell on the basis of the power consumption parameter acquired by the first parameter acquiring unit. The first storage unit stores the power consumption state value calculated by the first calculating unit.

13 Claims, 10 Drawing Sheets

(56) References Cited

U.S. PATENT DOCUMENTS

| | | | |
|---|---|---|---|
| 6,489,749 B1 * | 12/2002 | Nakashimo et al. | 320/134 |
| 6,563,291 B2 | 5/2003 | Tamura et al. | |
| 6,774,602 B2 * | 8/2004 | Ballard et al. | 320/103 |
| 7,211,987 B2 * | 5/2007 | Aoki et al | 320/134 |
| 7,847,436 B2 * | 12/2010 | Blackmond | 307/71 |
| 7,956,579 B2 * | 6/2011 | Dishman et al. | 320/119 |
| 2003/0015995 A1 | 1/2003 | Tamura et al. | |
| 2003/0057918 A1 * | 3/2003 | Aoki et al. | 320/136 |
| 2003/0231003 A1 * | 12/2003 | Ballard et al. | 320/116 |
| 2006/0061327 A1 | 3/2006 | Shen | |
| 2009/0102288 A1 * | 4/2009 | Blackmond | 307/71 |
| 2009/0160401 A1 * | 6/2009 | Dishman et al. | 320/119 |
| 2010/0033135 A1 | 2/2010 | Nishida et al. | |
| 2010/0286938 A1 * | 11/2010 | Kaneko | 702/63 |
| 2011/0119005 A1 * | 5/2011 | Majima et al. | 702/63 |

FOREIGN PATENT DOCUMENTS

| | | | |
|---|---|---|---|
| JP | 08-340112 A | | 12/1996 |
| JP | 2003-032907 A | | 1/2003 |
| JP | 2005-37230 A | * | 2/2005 |
| JP | 2007-113953 A | * | 5/2007 |
| JP | 2008-14702 A | * | 1/2008 |
| JP | 2008-211962 A | | 9/2008 |
| JP | 2008-228518 A | | 9/2008 |
| JP | 2009-513991 A | | 4/2009 |
| JP | 2011-64627 A | * | 3/2011 |

OTHER PUBLICATIONS

Japanese Office Action dated Jul. 12, 2011, issued in corresponding Japanese Patent Application No. 2009-216956.

European Office Action dated May 31., 2013, issued in correspoding European Patent Application No. 10 176 788.7 (4 pages).

* cited by examiner

BATTERY SYSTEM

BACKGROUND OF THE INVENTION

1. Field of the Invention

The present invention relates to a battery system that manages individually the degree of power consumption of each battery cell.

Priority is claimed on Japanese Patent Application No. 2009-216956, filed Sep. 18, 2009, the content of which is incorporated herein by reference.

2. Description of Related Art

In general, a control system that controls an assembled battery includes a plurality of CMUs (Cell Monitoring Units) that manages battery cells and a BMU (Battery Management Unit) that manages the operation of the CMUs. Each of the CMUs manages a plurality of battery cells. The CMUs are connected in parallel to the BMU. In recent years, a system has also been proposed which detects the charge state of a plurality of battery cells that is connected in series (for example, see Japanese Laid-Open Patent Publication No. 2003-032907).

However, one CMU can manage a plurality of battery cells at the same time. Therefore, in general, for example, the number of battery cells to be managed by one CMU is set to five in order to reduce the size of the battery system. In this case, the number of battery cells forming the assembled battery needs to be a multiple of five, such as 5, 10, 15, . . . . Therefore, in case of this structure used in the battery system, that uses 12 battery cells as an optimal number of battery cells, the assembled battery needs to be formed by ten battery cells with an insufficient power level, or the assembled battery needs to be formed by fifteen battery cells with wasteful spending. Otherwise, for example, it is necessary to place a special order for a CMU that manages six battery cells.

These battery systems can manage to charge or discharge each battery cell. Therefore, it is also possible to monitor, for example, the temperature and voltage of each battery cell, with the battery cells connected to the CMU and the BMU.

The battery cell is easily replaceable. However, the battery cell prepared for replacement is not always a new battery cell, but it may be a used battery cell. In particular, the battery cell of the secondary battery is rechargeable and can be used for a long time. Therefore, in case of replacing a battery cell in the battery system, a reused battery cell may be prepared for the replacement.

In this case, when the used or reused battery cell is connected to the CMU and the BMU to form the battery system, it is recognized for the first time that the battery cell is the used one or the reused one. When the health of the battery, that is, the power consumption of the battery at that time is not suitable for the use of the battery system, the battery cell is removed from the battery system and is replaced with another battery cell. This is likely to make the maintenance of the battery system complicated. In addition, the battery used for a mobile apparatus, such as an electric vehicle or an industrial vehicle, needs to be higher performance than that of the battery used for a stationary apparatus, such as an emergency power supply for home use. Therefore, it is important to manage the power consumption of the battery cell.

SUMMARY OF THE INVENTION

In one aspect of the present invention, a battery system comprises: a first battery cell; and a first management unit which is connected in one-to-one correspondence to the first battery cell, wherein the first management unit includes: a first parameter acquiring unit which acquires a power consumption parameter of the first battery cell; a first calculating unit which calculates a power consumption state value of the first battery cell on the basis of the power consumption parameter acquired by the first parameter acquiring unit; and a first storage unit which stores the power consumption state value calculated by the first calculating unit.

Each of the management units, such as CMUs, provided in one-to-one correspondence with the battery cells, calculates the power consumption state value and stores the calculated value in, for example, a memory. Therefore, it is possible to easily check whether the battery cell is suitable to be reused and whether the health of the battery reused is suitable for each system.

It is advisable that the storage unit is a non-volatile memory that can semi-permanently store information. This is because that the battery cell and the management unit, such as a CMU, may be left and that no power may be supplied for a long time, in a case of the reuse of the battery cell.

Moreover, in another aspect of the present invention, a battery system comprises: a second battery cell which is connected in series to the first battery cell; and a second management unit which is connected in one-to-one correspondence to the second battery cell, wherein the first management unit further includes: a first voltage detecting unit which detects a potential of a positive terminal of the first battery cell and a voltage between the positive terminal and a negative terminal of the first battery cell; and a first connection order calculating unit which calculates a result of a division by using the potential of the positive terminal and the voltage between the positive terminal and the negative terminal and which calculates a connection order of the first battery cell by using the result of the division, wherein the second management unit includes: a second parameter acquiring unit which acquires a power consumption parameter of the second battery cell; a second calculating unit which calculates a power consumption state value of the second battery cell on the basis of the power consumption parameter acquired by the second parameter acquiring unit; a second storage unit which stores the power consumption state value calculated by the second calculating unit; a second voltage detecting unit which detects a potential of a positive terminal of the second battery cell and a voltage between the positive terminal and a negative terminal of the second battery cell; and a second connection order calculating unit which calculates a result of a division by using the potential of the positive terminal and the voltage between the positive terminal and the negative terminal and which calculates a connection order of the second battery cell by using the result of the division, wherein the connection order calculated by the first connection order calculating unit is stored in the first storage unit so as to be associated with the power consumption state value of the first battery cell stored in the first storage unit, and the connection order calculated by the second connection order calculating unit is stored in the second storage unit so as to be associated with the power consumption state value of the second battery cell stored in the second storage unit.

In addition, in still another aspect of the present invention, a battery system comprises: a third management unit which is connected to the second management unit by a second bus, wherein the first and the second management units are connected to each other by a first bus, wherein the second management unit comprises: an internal bus; and a switching unit which selects alternatively a non-bypass path, which electrically connects the second parameter acquiring unit, the second calculating unit, the second storage unit, the second voltage detecting unit, and the second connection order calculating unit to the first and the second buses, or a bypass path, which electrically disconnects the second parameter acquiring unit, the second calculating unit, the second storage unit, the second voltage detecting unit, and the second connection order calculating unit from the first and second buses and which connects the first and the second buses to the internal bus, wherein the first or the third management unit comprises a switching control unit which determines whether a predetermined signal is output from the second management unit to the first or the second bus, wherein in case that the predetermined signal is not output, the switching control unit transmits a switching signal to the switching unit through the first or the second bus, wherein the switching unit selects the bypass path and changes to the bypass path from the non-bypass path.

In case that the battery system is used as an assembled battery in which battery cells are connected in series, it is possible to easily check the health of each of the battery cells, as described above. In addition, even though a failure occurs in, for example, the management unit of the CMU in the battery system of an electric vehicle during operation, the electronic vehicle does not need to instantaneously stop its operation in the place where a sudden stop is dangerous, such as an expressway, but the electronic vehicle can continuously travel to a safety zone.

The reason is as follows. Since an adjacent management unit, such as a CMU or a BMU, electrically bypasses a management unit that is out of order and electrically connects other management units, for example, a driver can recognize information of the battery cells that are managed by other management units.

For the power consumption parameters, a plurality of parameters that is considered to have a large effect on the performance of the battery system may be selected from the parameters, such as a voltage, a current, a case temperature, and a case voltage according to a purpose of the battery system (for example, use in a low temperature environment, use in a high temperature environment, and used for a long time) and the selected parameters may be used to calculate the power consumption state value.

The management units that are connected in series may include a plurality of CMUs that is connected in series and a BMU that is connected to the end of the CMU.

BRIEF DESCRIPTION OF THE DRAWINGS

The above features and advantages of the present invention will be more apparent from the following detailed description of certain preferred embodiments taken in conjunction with the accompanying drawings, in which.

DETAILED DESCRIPTION OF THE PREFERRED EMBODIMENTS

Hereinafter, exemplary embodiments of the invention will be described, but the following embodiments do not limit the invention described in the claims. All combinations of the characteristics described in the embodiments are not indispensable for the invention.

Figure 1:
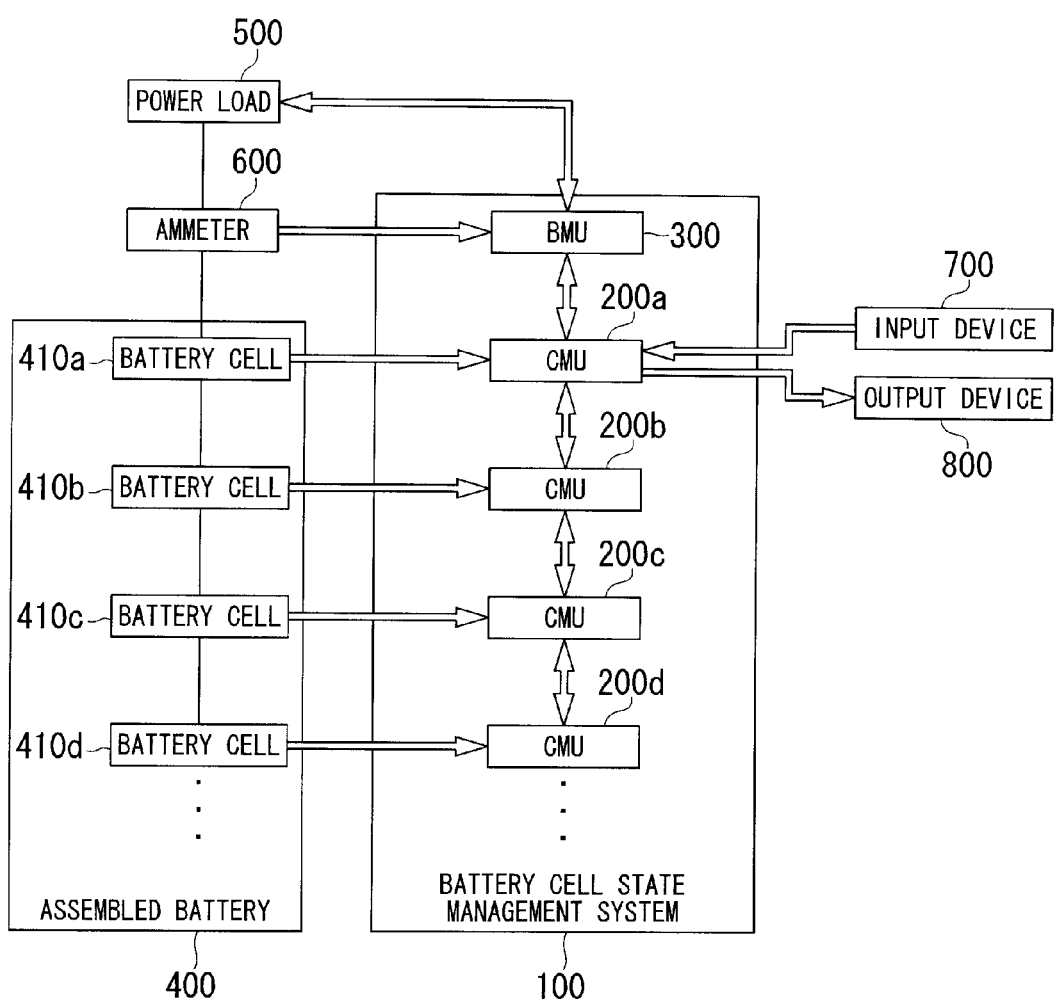
FIG. 1 is a diagram illustrating an example of the structure of an assembled battery management system according to an embodiment of the invention.

FIG. 1 is a diagram illustrating an example of the structure of an assembled battery management system according to an embodiment of the invention.

The assembled battery management system manages an assembled battery which is a storage battery of, for example, a battery-powered electric vehicle. The battery cell management system includes a battery cell state management system 100, an assembled battery 400, a power load 500, an ammeter 600, an input device 700, and an output device 800.

The assembled battery 400 is a battery that supplies power to the power load 500. The assembled battery 400 includes a plurality of battery cells, for example, four battery cells 410a to 410d (hereinafter, generically referred to as battery cells 410). The battery cells 410 are connected in series to each other. The assembled battery 400 may include a plurality of battery cell groups, each having a plurality of battery cells connected in series to each other, and the battery cell groups may be connected in parallel.

The battery cell state management system 100 manages the degree of power consumption of each battery cell 410. The battery cell state management system 100 includes a plurality of CMUs 200a to 200d (hereinafter, generically referred to as CMUs 200) and a BMU 300. The CMU 200 is an example of a battery cell management unit according to the invention. The BMU 300 is an example of an assembled battery management unit according to the invention.

The CMU 200 is a management unit that manages the degree of power consumption of the corresponding battery cell 410. The CMUs 200 are provided in one-to-one correspondence with the battery cells 410. For example, the CMU 200a is provided so as to correspond to only the battery cell 410a. Similarly, the CMUs 200b to 200d are provided so as to respectively correspond to the battery cells 410b to 410d. When a plurality of battery cell groups forms the assembled battery 400, the CMUs 200 are also provided in one-to-one correspondence with the battery cells 410 in each battery cell group.

The CMUs 200 are connected to each other through a bus for data communication. In this case, it is preferable that each of the CMUs 200 is connected in the same order respectively as each of the corresponding battery cells 410 connected to each other. For example, the battery cells 410 are connected in series in the order of the battery cell 410a, the battery cell 410b, the battery cell 410c, and the battery cell 410d. Therefore, the CMUs 200 are connected in the order of the CMU 200a, the CMU 200b, the CMU 200c, and the CMU 200d. One of the CMUs 200 receives data from another CMU 200 connected thereto on one side, performs a necessary process on the received data, and transmits the data to the other CMU 200 that is connected thereto on the other side. For example, the CMU 200b receives data from the CMU 200a, performs a necessary process on the received data, and transmits the data to the CMU 200c. In addition, the CMU 200b receives data from the CMU 200c, performs a necessary process on the received data, and transmits the data to the CMU 200a. However, only one CMU 200 is connected to the CMU 200 that is connected to the end. Therefore, the CMU 200 connected to the end receives data from another CMU 200, performs a necessary process on the received data, and transmits the data to the CMU 200 that has transmitted the data. The CMU 200a connected to the BMU 300 receives data from the BMU 300, performs a necessary process on the received data, and transmits the data to the CMU 200b. In addition, the CMU 200a receives data from the CMU 200b, performs a necessary process on the received data, and transmits the data to the BMU 300. The CMU 200 has a function of monitoring the state of the battery cell 410 that has been managed by the CMU 200. The CMU 200 monitors the state of the battery cell 410, such as a battery temperature, an inter-terminal voltage, and a case voltage. In case of an error in the state of the battery cell, the CMU 200 notifies the BMU 300 that an error has occurred. In addition, the CMU 200 has a function of calculating SOC (State of Charge) in cooperation with the BMU 300 and a function of balancing a voltage of each of the battery cells 410 which is called as "cell balance".

The BMU 300 is a management unit that manages the degree of power consumption of the assembled battery 400. The BMU 300 is connected to any one of the CMUs 200 through the bus for data communication. The BMU 300 performs data communication with the CMUs 200 that are connected in series to each other. For example, data is transmitted from the BMU 300 to the CMU 200d through the CMU 200a, the CMU 200b, and the CMU 200c according to this order. In addition, data is transmitted from the CMU 200d to the BMU 300 through the CMU 200c, CMU 200b, and the CMU 200a according to this order. The BMU 300 receives data indicating the degree of power consumption of each battery cell 410 (the data is indicating a power consumption state value Y, which will be described below) from each CMU 200, and manages the degree of power consumption of the assembled battery 400. In case that the assembled battery 400 includes a plurality of battery cell groups that is connected in parallel, each of BMUs corresponding to the BMU 300 may be provided respectively in each battery cell group, or only one BMU 300 may be provided in the assembled battery 400.

The power load 500 is a system or an apparatus that is operated by power supplied from the assembled battery 400. The power load 500 is, for example, an electric motor that is connected to a wheel. In this case, examples of the battery system including the assembled battery 400, the battery cell state management system 100, the input device 700, and the output device 800 include an industrial vehicle, such as a forklift, an electric vehicle, a hybrid vehicle, and an electric train. In addition, the battery system may be a ship or an airplane having an electric motor connected to a propeller. The electric motor may drive a peripheral device, such as a wiper, as well as the wheel or the propeller.

The power load 500 is connected to the BMU 300 through a bus for data communication. The power load 500 transmits data for imforming the on/off states of the apparatus or the system, that is operated by the power supplied from the assembled battery 400, to the BMU 300.

The ammeter 600 is an electric meter that measures an electric current output from the assembled battery 400 to the power load 500. The ammeter 600 also measures the current input from a charging apparatus or a power generating apparatus (not shown) to the battery cell 410 when the battery cell 410 is charged. The ammeter 600 is connected to the BMU 300 through a bus for data communication. The ammeter 600 transmits data indicating the measured current value to the BMU 300.

The input device 700 receives a command from a user, to output information indicating the degree of power consumption of the battery cell 410. Examples of the input device 700 may include a keyboard, a touch panel, or a switch that is provided in a maintenance device for checking the degree of power consumption of the battery cell 410. For example, in the electric vehicle, it is considered that switches near the driver's seat, provided in the periphery of an instrument panel, are used as the input device 700.

The input device 700 is connected to the CMU 200 through a bus for data communication. The input device 700 transmits data indicating a command input from the user to the CMU 200. The input device 700 receives the command to output information indicating the degree of power consumption of the battery cell 410 that is managed by the CMU 200. In the example shown in FIG. 1, the input device 700 is connected to the CMU 200a. Therefore, the command received by the input device 700 becomes a command to output information indicating the degree of power consumption of the battery cell 410a that is managed by the CMU 200a. It goes without saying that, when a command to output information indicating the degree of power consumption of the battery cell 410b is issued, the input device 700 is connected to the CMU 200b.

The input device 700 may be connected to the BMU 300 through a bus for data communication. In this case, the input device 700 receives a command to output information indicating the degree of power consumption of a target battery cell 410 after the target battery cell 410 is designated. The battery cells 410 may be individually designated, or sets of a plurality of battery cells 410 may be designated.

The output device 800 outputs information (power consumption state value Y which will be described below) indicating the degree of power consumption of each battery cell 410 and the connection order of the battery cell, which will be described below. Examples of the output device 800 may include a monitor, a printer, or an LED, that is provided in a maintenance device for checking the degree of power consumption of the battery cell 410. For example, in the electric vehicle, an instrument panel or a monitor for a car navigation system may be used as the output device 800. The output device 800 is connected to the CMU 200 through a bus for data communication. The output device 800 receives data from the CMU 200, which indicates the degree of power consumption of the battery cell 410 to be managed by the CMU 200, and outputs information indicating the degree of power consumption represented by the data. The output device 800 may be connected to the BMU 300 through a bus for data communication. In this case, the output device 800 receives data indicating the degree of power consumption of the battery cell 410 designated by the input device 700.

Figure 2:
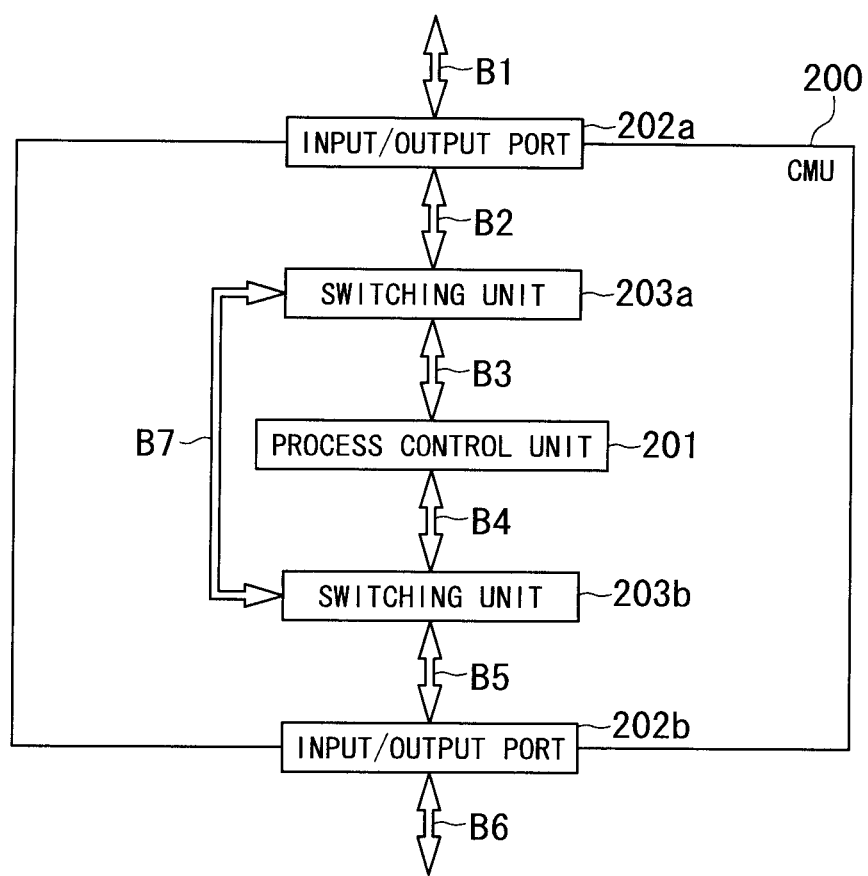
FIG. 2 is a diagram illustrating an example of the structure of a CMU 200.

FIG. 2 is a diagram illustrating an example of the structure of the CMU 200.

The CMU 200 includes a process control unit 201, input/output ports 202a and 202b, and switching units 203a and 203b. In the following description, when one of the CMUs 200 as shown in FIG. 1 is focused, another CMU 200 that is connected to the CMU 200 on the side of the BMU 300 is referred to as an upstream CMU 200, and the other CMU 200 that is connected to the CMU 200 on the other side of the BMU 300 is referred to as a downstream CMU 200.

The process control unit 201 is a processing unit that performs a process to manage the degree of power consumption of the battery cell 410, which is a management target. The process control unit 201 performs data communication with the upstream CMU 200 through the input/output port 202a. The input/output port 202a is connected to the upstream CMU 200 through an external bus B1 for data communication. In addition, the process control unit 201 performs data communication with the downstream CMU 200 through the input/output port 202b. The input/output port 202b is connected to the downstream CMU 200 through an external bus B6 for data communication.

The switching unit 203a is provided between the process control unit 201 and the input/output port 202a. The switching unit 203a and the process control unit 201 are connected to each other through an internal bus B3 for data communication. The switching unit 203a and the input/output port 202a are connected to each other through an internal bus B2 for data communication. Similarly, the switching unit 203b is provided between the process control unit 201 and the input/output port 202b. The switching unit 203b and the process control unit 201 are connected to each other through an internal bus B4 for data communication. In addition, the switching unit 203b and the input/output port 202b are connected to each other through an internal bus B5 for data communication. A bypass that does not pass through the process control unit 201 is provided between the switching unit 203a and the switching unit 203b. The bypass is formed by an internal bus B7 for data communication.

The switching unit 203a and the switching unit 203b work as switches that alternatively select the path of data in the CMU 200 between a path passing through the process control unit 201 via the bus B3 and the bus B4 and a path passing through the bus B7, which is the bypass. It is supposed that the process control unit 201 is normally operated immediately after the battery system is made. Therefore, the switching units 203a and 203b are initially set to select the path of data through the process control unit 201 via the bus B3 and the bus B4. In case that the process control unit 201 is out of order, the switching units 203a and 203b are controlled to select the path of data through the bus B7 as the bypass.

The upstream CMU 200 (specifically, a switching control unit 290 which will be described below), that is connected through the bus B1, or the BMU 300 (specifically, a switching control unit 340 which will be described below) controls the switching units 203a and 203b to switch or select the path. For example, the switching unit 203a of the CMU 200b shown in FIG. 1 includes a first switching control unit (not shown) that simultaneously controls these two switching units connected to the switching unit 203b. When the switching unit 203a receives a switching signal transmitted from the switching control unit 290 (which will be described below with reference to FIG. 6) of the upstream CMU 200a to the bus B1, the switching unit 203a and the switching unit 203b are switched at the same time. That is, the first switching control unit switches the path to the bus B7, which is the bypass.

During the transmission of data to another CMU 200 connected thereto, when the CMU 200 and the BMU 300 cannot receive data indicating the reception of data from another CMU 200 after a predetermined time has elapsed from the transmission of data or when measured data is not transmitted from another CMU 200 within a predetermined period of time, that is, when the process control unit 201 of another CMU 200 is out of order, the CMU 200 and the BMU 300 control the switching unit 203 of the CMU 200, which is a destination of data, to switch the path to the bus B7, which is the bypass. When the path is switched to the bus B7, which is the bypass, data transmitted from another CMU 200 passes through only the bus B7, which is the bypass, without passing through the process control unit 201 which is out of order.

In this embodiment, the upstream CMU 200 or the BMU 300 controls the switching operation of the switching unit 203a and the switching unit 203b. However, the switching control may be performed by the downstream CMU 200. For example, when the process control unit 201 of the CMU 200b is out of order, the downstream CMU 200c cannot receive any valid data. When the CMU 200c cannot receive valid data after a predetermined time has elapsed, the switching control unit 290 (which will be described below with reference to FIG. 6) of the process control unit 201 of the CMU 200c transmits a switching signal to the upstream bus B1. The switching unit 203b of the CMU 200b having the process control unit 201 that is out of order, includes a second switching control unit (not shown) that is connected to the switching unit 203a of the CMU 200b and controls the two switching units at the same time. When the switching unit 203b receives the switching signal transmitted from the CMU 200c, the second switching control unit switches the path to the bus B7, which is the bypass. In this way, the CMU 200c can receive data transmitted from the BMU 300 or the CMU 200a.

Figure 3:
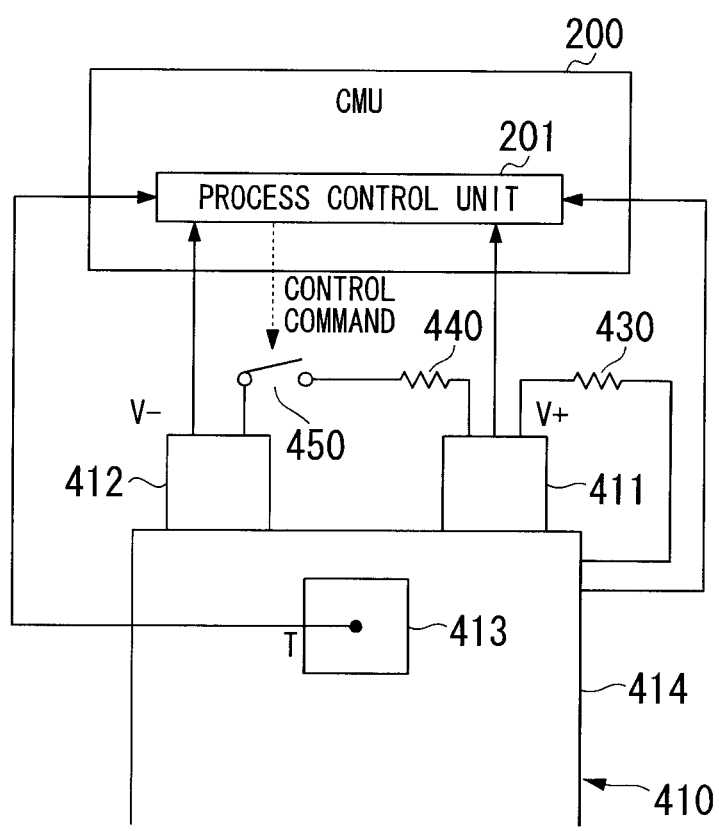
FIG. 3 is a diagram illustrating an example of the connection between a battery cell 410 and the CMU 200.

FIG. 3 is a diagram illustrating an example of the connection structure between the battery cell 410 and the CMU 200.

A case body 414 of the battery cell 410 includes a temperature measuring circuit 413. The temperature measuring circuit 413 includes a sensor that measures the temperature of the battery cell 410. The process control unit 201 of the CMU 200 acquires data indicating the temperature value of the battery cell 410 measured by the temperature measuring circuit 413. In addition, the process control unit 201 of the CMU 200 detects the potential value of a positive terminal 411 with respect to a reference potential. The process control unit 201 of the CMU 200 detects the voltage between the positive terminal 411 and a negative terminal 412. In the battery cell 410, in some cases, the case body 414 and the positive terminal 411 are connected to each other with a resistor 430 interposed therebetween in order to obtain a significant potential of the case body 414. The process control unit 201 of the CMU 200 may be configured so as to detect the potential value of the case body 414.

The battery cell 410 is provided with a balance circuit for a voltage balance when there is a voltage variation among the battery cells 410. The balance circuit is operated to reduce the voltage of the battery cell 410. The balance circuit includes, for example, a switch 450 that switches the on/off of the connection between the positive terminal 411 and the negative terminal 412 with the resistor 440 interposed therebetween. The balance circuit turns on or off the switch 450 in response to a control command from the CMU 200.

A process until the balance circuit is operated will be described briefly below. The CMU 200 monitors the voltage of the battery cell 410 to be managed and transmits data indicating the voltage value to the BMU 300. The BMU 300 compares the values of the battery cells 410 indicated by the data received from each CMU 200. When there is the difference between the voltage values of the battery cells 410, the BMU 300 transmits data for instructing the operation of the balance circuit to the CMU 200 that manages the battery cell 410 with a high voltage. The CMU 200 receiving the data transmits data indicating a control command to the balance circuit such that the balance circuit turns on the switch 450. Then, the balance circuit turns on the switch 450 according to the command.

Figure 4:
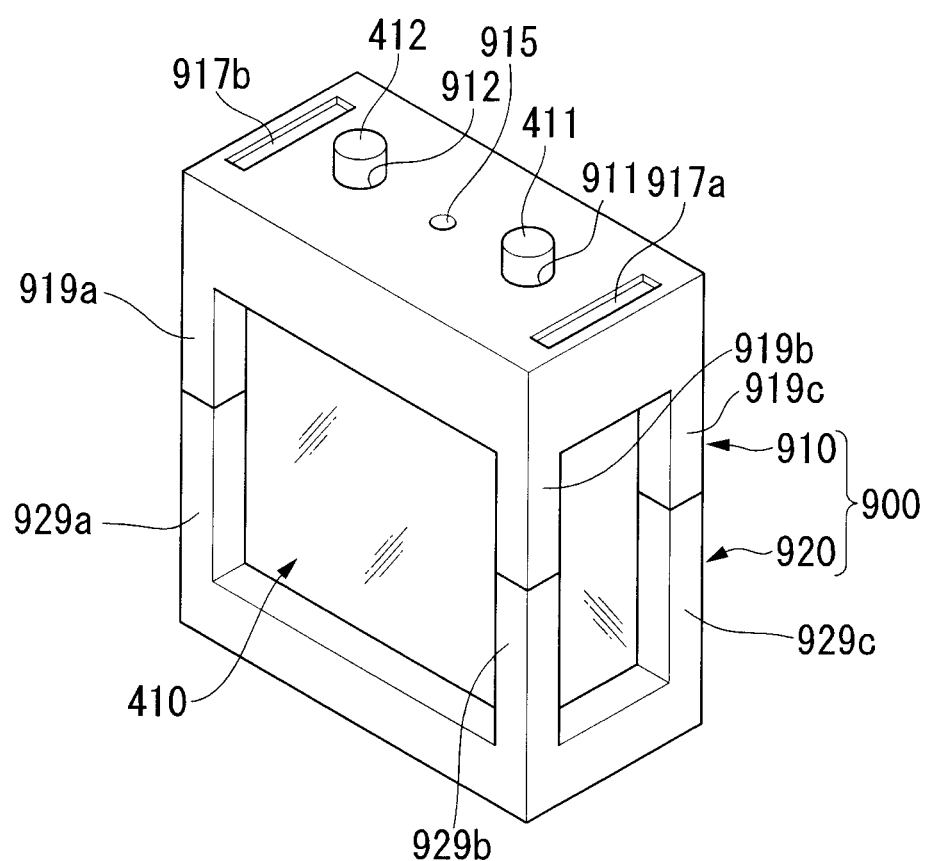
FIG. 4 is a perspective view illustrating a battery cell unit 990 including a cover unit 900 for attaching the CMU 200 to the battery cell 410.
Figure 5:
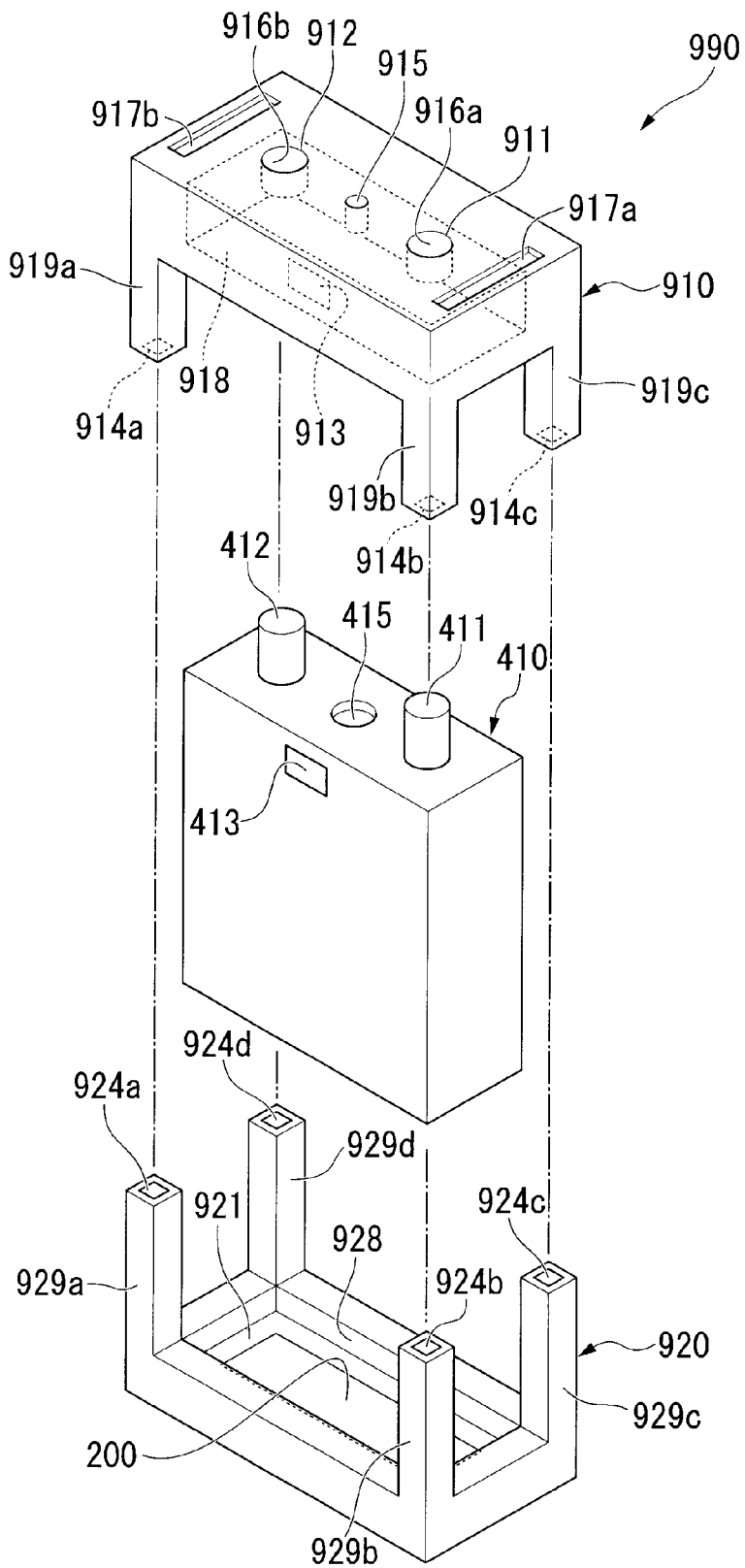
FIG. 5 is a perspective view illustrating a cover unit 900 which is disassembled in the vertical direction in a battery cell unit 990 shown in FIG. 4.

FIG. 4 is a perspective view illustrating a battery cell unit 990 including a cover unit 900 for attaching the CMU 200 to the battery cell 410. FIG. 5 is a perspective view illustrating the cover unit 900 which is disassembled in the vertical direction in the battery cell unit 990 shown in FIG. 4.

The battery cell unit 990 has a structure in which the battery cell 410 and the CMU 200 are provided in the cover unit 900. The cover unit 900 is made of an insulating material, such as plastic, and can be divided into an upper cover 910 and a lower cover 920. The battery cell 410 can be provided between the upper cover 910 and the lower cover 920.

The upper cover 910 includes a concave portion 918 to which an upper part of the battery cell 410 is fitted. Supports 919a to 919d are formed at four corners of the upper cover 910 so as to extend downward. Holes 911 and 912 through which the positive terminal 411 and the negative terminal 412 of the battery cell 410 pass when the battery cell 410 is fitted are formed in the upper part of the upper cover 910. In this way, when the battery cell 410 is fitted to the concave portion 918 of the upper cover 910, a portion of the leading end of each of the positive terminal 411 and the negative terminal 412 of the battery cell 410 is exposed to the outside of the case body of the upper cover 910.

A hole 915 through which gas is discharged to the outside when the safety valve 415 is released, is formed in the upper cover at a position, where it faces the safety valve 415 of the battery cell 410 when the battery cell 410 is fitted to the concave portion 918 of the upper cover 910 and where the positive terminal 411 and the negative terminal 412 respectively pass through the holes 911 and 912.

A metal terminal 913 that is electrically connected to the temperature measuring circuit 413 of the battery cell 410 when the battery cell 410 is fitted, is provided on the side surface of the upper cover 910. In addition, metal contacts 916a and 916b that are electrically connected to the positive terminal 411 and the negative terminal 412 of the battery cell 410 are provided around the holes 911 and 912 of the upper cover 910, respectively.

Input/output connectors 917a and 917b are formed on the upper surface of the upper cover 910. Connectors of a bus cable (for example, a cable for the bus B1 or B6) for transmitting or receiving data are connected to the input/output connectors 917a and 917b. Connectors at the other end of the cable are connected to the input/output connectors 917a and 917b of another cover unit 900. As such, since the cover units 900 are connected to each other by the cable, it is possible to perform data communication between the CMUs 200 provided in the cover units 900. The cover units 900 may be connected to each other by the cable. Therefore, it is easy to connect the cover units with the cable.

Metal terminals 914a to 914d are provided on the leading end surfaces of the supports 919a, 919b, 919c and 919d (not shown) of the upper cover 910, respectively. The metal terminals 914a, 914b, 914c and 914d (not shown) are electrically connected to the metal terminal 913, the metal contacts 916a and 916b, the input/output connectors 917a and 917b, and the balance circuit (not shown). Since the input/output connectors 917a and 917b are connected to the bus cable, they are multi-pin connectors. In addition, since there are electrical connection to the metal terminal 913 and the two metal contacts and electrical connection for controlling the balance circuit, at least four or more electric paths are formed between the upper cover and the CMU 200 of the lower cover 920, which will be described below, through the four supports 919a, 919b, 919c and 919d (not shown). Therefore, some or all of the metal terminals 914a, 914b, 914c and 914d (not shown) are multi-pin terminals (or multi-pin connectors) capable of transmitting a plurality of electric signals.

A concave portion 928 to which a lower part of the battery cell 410 is fitted is formed in the lower cover 920. Supports 929a to 929d are formed at four corners of the lower cover 920 so as to extend upward. The CMU 200 is buried in the bottom 921 of the lower cover 920. The reason is as follows. Since the temperature of the upper part of the battery cell 410 is high, it is preferable that an integrated circuit, such as the CMU that is relatively weak against high temperature, be provided in the lower cover 920 rather than in the upper cover 910. In addition, in general, the safety valve 415 is provided at the upper part of the battery cell 410. Therefore, when the CMU 200 is provided at the upper part of the battery cell 410, the circuit is out of order during the operation of the safety valve 415, which leaves no failure history.

Metal terminals 924a to 924d are provided on the leading end surfaces of the supports 929a to 929d of the lower cover. The metal terminals 924a to 924d have a shape in which they are respectively fitted to the corresponding metal terminals 914a, 914b, 914c and 914d (not shown) that are electrically connected thereto. The metal terminals 924a to 924d are electrically connected to the CMU 200 inside the lower cover 920.

The battery cell unit 990 is formed by interposing the battery cell 410 between the upper cover 910 and the lower cover 920. Therefore, the CMU 200 can acquire, for example, the temperature or the inter-terminal voltage of the battery cell 410 and the potential value of the positive terminal 411 with respect to the reference potential through the metal terminals provided in the upper cover 910 and the lower cover 920.

When the input device 700 and the output device 800 are connected to the input/output connectors 917a and 917b, it is possible to output the power consumption state value Y (which will be described below) of the battery cell in the battery cell unit 990. When a maintenance engineer carries and uses the input device 700 and the output device 800 as portable test devices, the battery cell and the CMU that is in one-to-one correspondence with the battery cell are integrated and carried as the battery cell unit 990. Therefore, when the battery cell is replaced in the battery system of, for example, an electric vehicle into which the assembled battery including a plurality of battery cells is incorporated, it is possible to determine whether each used battery cell to be incorporated is in a good state with low power consumption before it is incorporated into the battery system. That is, it is possible to effectively replace the battery cell.

During replacement, since one battery cell and one CMU corresponding thereto are integrally arranged as the battery cell unit 990, it is easy to treat the battery cell and the CMU, as compared to the structure in which the battery cell and the CMU are not integrally provided.

The structure using the cover unit 900 having a square shape has been described above, but the shape of the cover unit 900 is not limited to the square shape. The cover unit 900 may have various shapes according to the shape of the battery cell 410. For example, when the battery cell 410 has a substantially cylindrical shape, the cover unit 900 may have a shape capable of accommodating the battery cell 410 having a substantially cylindrical shape. That is, the cover unit 900 may have a substantially cylindrical shape when the upper cover 910 and the lower cover 920 are combined with each other. And the cover unit 900 may have a square shape in appearance when the upper cover 910 and the lower cover 920 are combined with each other, but each of the concave portion 918 of the upper cover 910 and the concave portion 928 of the lower cover 920 may have a substantially cylindrical shape according to the shape of the battery cell 410.

In this embodiment, the supports 919*a*, 919*b*, 919*c* and 919*d* (not shown) of the upper cover 910 and the supports of the lower cover 920 are formed at the four corners of the upper and lower covers. However, the positions of the supports 919*a*, 919*b*, 919*c* and 919*d* (not shown) and 929*a*, 929*b*, 929*c* and 929*d* are not limited thereto. That is, the supports 919*a*, 919*b*, 919*c* and 919*d* (not shown) and 929*a*, 929*b*, 929*c* and 929*d* may be formed such that the leading ends of the supports 919*a*, 919*b*, 919*c* and 919*d* (not shown) and the leading ends of the supports 929*a*, 929*b*, 929*c* and 929*d* come into contact with each other when the upper cover 910 and the lower cover 920 are combined, or they may be formed at positions that come into contact with the side surface of the battery cell 410. The four supports 919*a*, 919*b*, 919*c* and 919*d* (not shown) and the four supports 929*a*, 929*b*, 929*c* and 929*d* are not necessarily formed, but the number of supports 919*a*, 919*b*, 919*c* and 919*d* (not shown) may be equal to the number of supports 929*a*, 929*b*, 929*c* and 929*d*. When the supports 919*a*, 919*b*, 919*c* and 919*d* (not shown) and 929*a*, 929*b*, 929*c* and 929*d* of the upper cover 910 and the lower cover 920 are fitted to each other with the battery cell 410 interposed between the upper and lower covers, a portion of the battery cell 410 is not covered with the covers, and it is possible to effectively dissipate heat from the non-covered portion.

Figure 6:
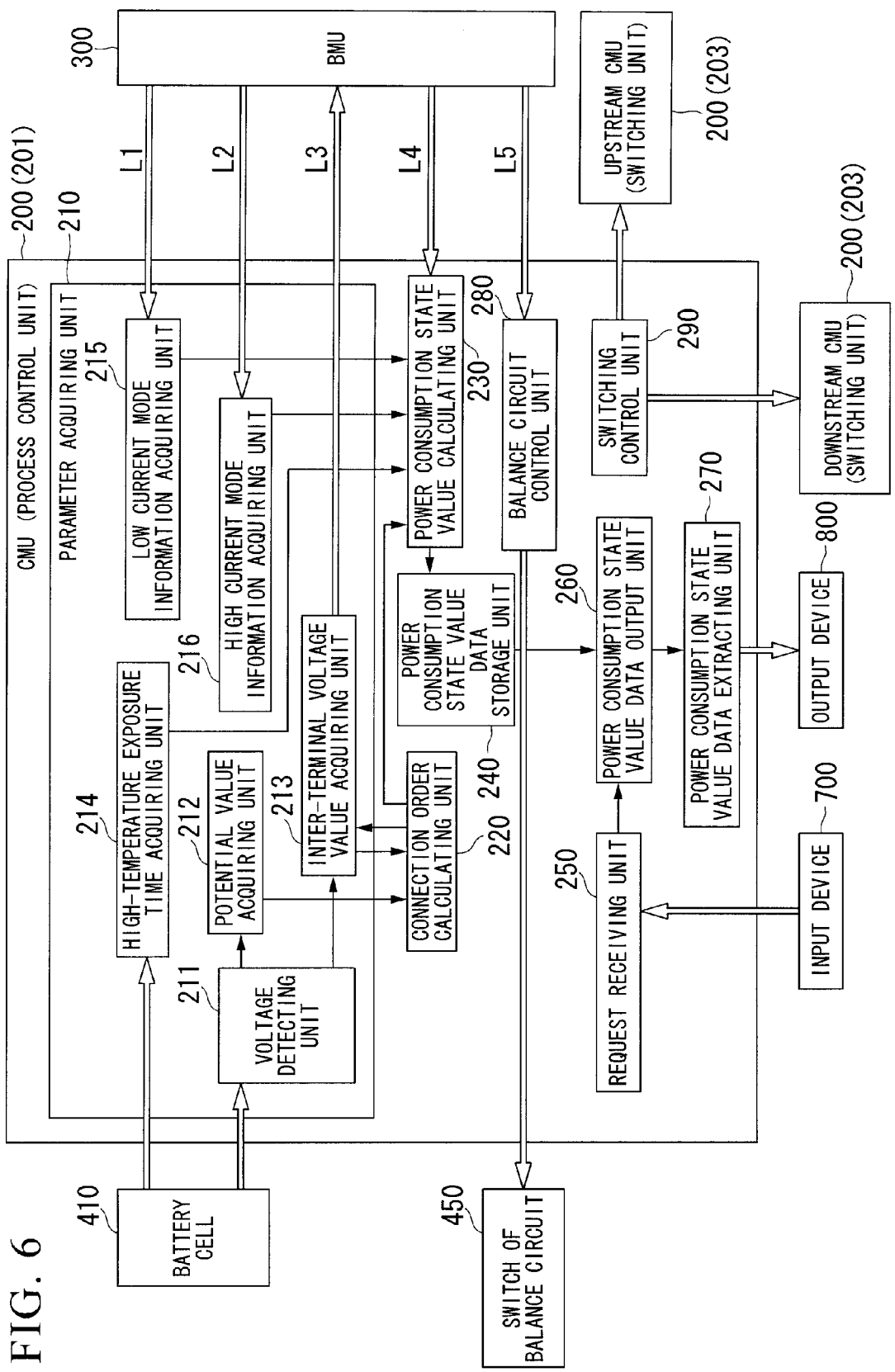
FIG. 6 is a block diagram illustrating a functional structure of the CMU 200.
Figure 7:
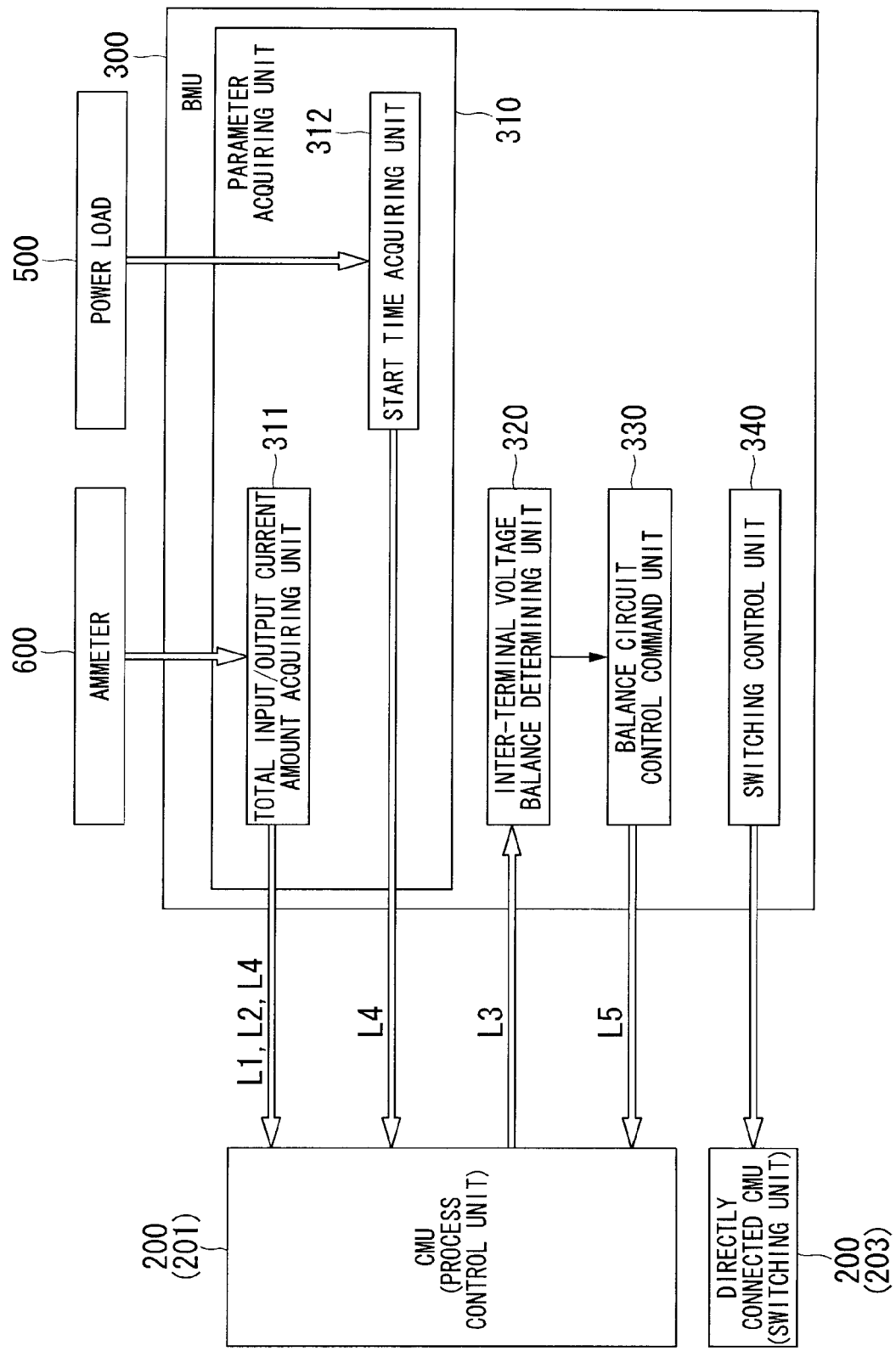
FIG. 7 is a block diagram illustrating a functional structure of a BMU 300.

FIG. 6 is a block diagram illustrating the functional structure of the CMU 200. FIG. 7 is a block diagram illustrating the functional structure of the BMU 300.

Next, the functional structure of the CMU 200 shown in FIG. 6 will be described with reference to the functional structure of the BMU 300 shown in FIG. 7.

The CMU 200 includes an intrinsic parameter acquiring unit 210, a connection order calculating unit 220, a power consumption state value calculating unit 230, a power consumption state value data storage unit 240, a request receiving unit 250, a power consumption state value data extracting unit 260, a power consumption state value data output unit 270, a balance circuit control unit 280, and a switching control unit 290.

The intrinsic parameter acquiring unit 210 is a processing unit that acquires parameters related to the battery cell 410 to be managed. The intrinsic parameter acquiring unit 210 includes a voltage detecting unit 211, a potential value acquiring unit 212, an inter-terminal voltage value acquiring unit 213, a high-temperature exposure time acquiring unit 214, a low current mode information acquiring unit 215, and a high current mode information acquiring unit 216.

The voltage detecting unit 211 is a processing unit that detects a voltage value between the positive terminal 411 and the negative terminal 412 of the battery cell 410 to be managed and the potential value of the positive terminal 411 of the battery cell 410 to be managed with respect to the reference potential. The voltage detecting unit 211 is connected to the positive terminal 411 of the battery cell 410 to be managed. In addition, the voltage detecting unit 211 is connected to the negative terminal 412 of the battery cell 410 to be managed. For example, the voltage detecting unit 211 is connected to the reference potential (not shown), such as the ground for a signal of the bus that connects the CMUs 200. The voltage detecting unit 211 detects the potential of the positive terminal 411 with respect to the reference potential, and transmits data indicating the detected potential value to the potential value acquiring unit 212. The voltage detecting unit 211 detects the potential of the positive terminal 411 with respect to the potential of the negative terminal 412, and transmits data indicating the detected potential value as data indicating the inter-terminal voltage value to the inter-terminal voltage value acquiring unit 213.

The potential value acquiring unit 212 is a processing unit that acquires a value indicating the potential of the positive terminal 411 of the battery cell 410 to be managed with respect to the reference potential. The potential value acquiring unit 212 receives the data indicating the potential value from the voltage detecting unit 211 and transmits the data to the connection order calculating unit 220.

The inter-terminal voltage value acquiring unit 213 is a processing unit that acquires a value indicating the voltage between the positive terminal 411 and the negative terminal 412 of the battery cell 410 to be managed. The inter-terminal voltage value acquiring unit 213 receives data indicating the inter-terminal voltage value from the voltage detecting unit 211, and transmits the data to the connection order calculating unit 220. The inter-terminal voltage value acquiring unit 213 receives data indicating the connection order of the battery cell 410 to be managed from the connection order calculating unit 220, and transmits the data indicating the connection order and the data indicating the inter-terminal voltage value to the inter-terminal voltage balance determining unit 320 of the BMU 300 through the bus L3.

The high-temperature exposure time acquiring unit 214 is a processing unit that acquires the time for which the temperature of the battery cell 410 to be managed is equal to or greater than a predetermined value. The high-temperature exposure time acquiring unit 214 receives a value indicating the temperature of the battery cell 410 to be managed from the temperature measuring circuit 413 of the battery cell 410 and counts the time for which the temperature is equal to or greater than a predetermined value. The high-temperature exposure time acquiring unit 214 transmits data indicating the counted time to the power consumption state value calculating unit 230.

The time for which the temperature is equal to or greater than the predetermined value is a factor for calculating the power consumption state value Y of the battery cell, which will be described below. One or more predetermined values, that is, one or more temperature threshold values may be provided, a weight coefficient may be set for each temperature range, data indicating the sum of values obtained by multiplying each time within the temperature range by the coefficients may be transmitted to the power consumption state value calculating unit 230, and the data may be used as a factor for calculating the power consumption state value Y. Hereinafter, the temporal calculation element is referred to as a temperature deterioration condition number $T_H$.

Figure 8:
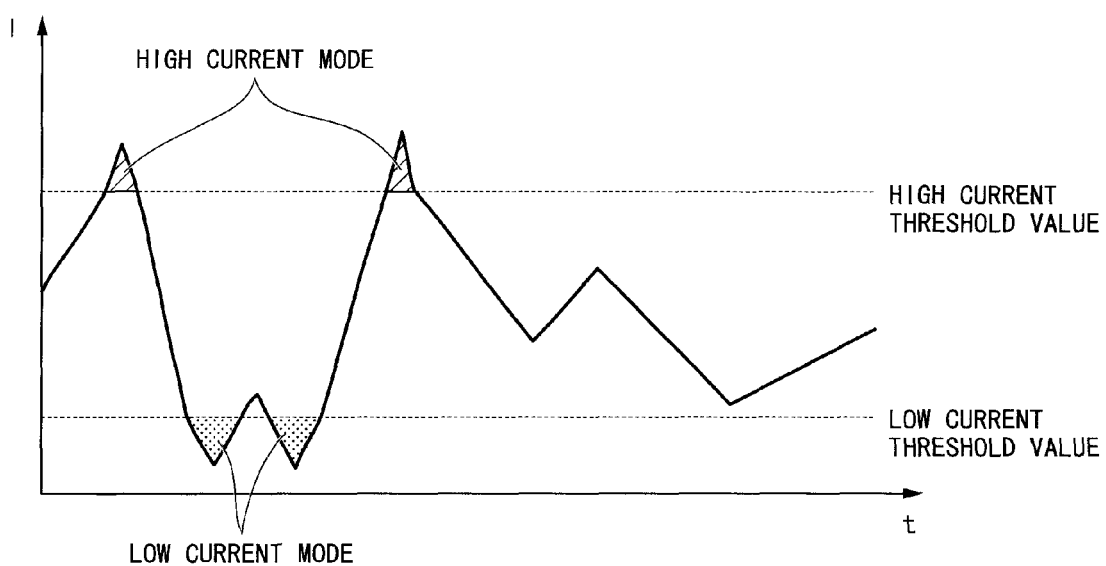
FIG. 8 is a diagram illustrating a variation in the value of current flowing through an assembled battery 400.

The low current mode information acquiring unit 215 is a processing unit that acquires information indicating that a current input to the battery cell 410 to be managed and a current output from the battery cell 410 to be managed are equal to or less than a predetermined low current threshold value (see FIG. 8: hereinafter, referred to as a low current mode). The low current mode information acquiring unit 215 receives data indicating the current value measured by the ammeter 600 from a total input/output current amount acquiring unit 311 of a common parameter acquiring unit 310 of the BMU 300 through the bus L1, and counts, for example, the number of times the low current mode is performed.

The low current mode information acquiring unit 215 transmits data indicating the count value to the power consumption state value calculating unit 230. The low current mode information acquiring unit 215 may calculate, for example, the integrated value of the absolute value of a value obtained by subtracting a threshold value from a current value in the low current mode, without counting the number of times the low current mode is performed. This is because the integrated value can represent the damage of the battery more accurately than the number of times the current value is equal to or greater than a predetermined threshold value. In this case, the low current mode information acquiring unit 215 transmits data indicating the calculated value to the power consumption state value calculating unit 230.

The number of times the low current mode is performed or the integrated value is related to a low current and is a factor for calculating the power consumption state value Y of the battery cell, which will be described below. Hereinafter, the low current element is referred to as a low current condition number $N_L$.

The high current mode information acquiring unit 216 is a processing unit that acquires information indicating that a current input to the battery cell 410 to be managed and a current output from the battery cell 410 to be managed are equal to or greater than a predetermined high current threshold value (see FIG. 8: hereinafter, referred to as a high current mode). The high current mode information acquiring unit 216 receives data indicating the current value measured by the ammeter 600 from the total input/output current amount acquiring unit 311 of the common parameter acquiring unit 310 of the BMU 300 through the bus L2, and counts, for example, the number of times the high current mode is performed. Then, the high current mode information acquiring unit 216 transmits data indicating the count value to the power consumption state value calculating unit 230. The high current mode information acquiring unit 216 may calculate, for example, the integrated value of the absolute value of a value obtained by subtracting a threshold value from a current value in the high current mode, without counting the number of times the high current mode is performed. Similar to the above, this is because the integrated value can represent the damage of the battery more accurately than the number of times the current value is equal to or greater than a predetermined threshold value. In this case, the high current mode information acquiring unit 216 transmits data indicating the calculated value to the power consumption state value calculating unit 230.

The number of times the high current mode is performed or the integrated value is related to a high current and is a factor for calculating the power consumption state value Y of the battery cell, which will be described below. Hereinafter, the high current element is referred to as a high current condition number $N_H$.

The connection order calculating unit 220 is a processing unit that calculates the connection order of the battery cell 410 to be managed. The connection order calculating unit 220 receives the data indicating the potential value of the positive terminal 411 of the battery cell 410 to be managed with respect to the reference potential from the potential value acquiring unit 212. In addition, the connection order calculating unit 220 receives the value indicating the inter-terminal voltage of the battery cell 410 to be managed from the inter-terminal voltage value acquiring unit 213. Then, the connection order calculating unit 220 calculates the connection order of the battery cell 410 to be managed on the basis of the values indicated by the received data, and transmits data indicating the calculated connection order to the inter-terminal voltage value acquiring unit 213 and the power consumption state value calculating unit 230. The calculation of the connection order will be described below.

The power consumption state value calculating unit 230 is a processing unit that calculates a value indicating the degree of power consumption of the battery cell 410 to be managed. The power consumption state value calculating unit 230 receives data indicating the temperature deterioration condition number $T_H$ of the battery cell 410 to be monitored from the high-temperature exposure time acquiring unit 214. The power consumption state value calculating unit 230 receives data indicating the low current condition number $N_L$ from the low current mode information acquiring unit 215. In addition, the power consumption state value calculating unit 230 receives data indicating the high current condition number $N_H$ from the high current mode information acquiring unit 216. The power consumption state value calculating unit 230 receives the integrated value of the absolute value of the current value measured by the ammeter 600, that is, data indicating a total input/output current amount Q from the total input/output current amount acquiring unit 311 of the BMU 300 through the bus L4. In addition, the power consumption state value calculating unit 230 receives the count value of the start time of the power load 500 after the power load 500 receives power supplied from the assembled battery 400, that is, data indicating a start time T from a start time acquiring unit 312 of the BMU 300. Then, the power consumption state value calculating unit 230 calculates a value indicating the degree of power consumption of the battery cell 410 to be managed, that is, the power consumption state value Y, on the basis of the data. The calculation of the power consumption state value Y will be described below.

The power consumption state value calculating unit 230 receives data indicating the connection order of the battery cell 410 to be managed from the connection order calculating unit 220. Then, the power consumption state value calculating unit 230 stores the data indicating the power consumption state value Y of the battery cell 410 to be managed and the data indicating the connection order of the battery cell 410 to be managed in the power consumption state value data storage unit 240 so as to be associated with each other.

It is preferable that the power consumption state value data storage unit 240 be a non-volatile memory that maintains stored information even though the supply of electric power is cut.

The request receiving unit 250 is a processing unit that receives a request to output data indicating the power consumption state value Y of the battery cell 410 to be managed from the user. The request receiving unit 250 receives data indicating the request to output data indicating the power consumption state value Y of the battery cell 410 to be managed from the user from the input device 700, and transmits data indicating a command to extract the data indicating the power consumption state value Y of the battery cell 410 to be managed to the power consumption state value data extracting unit 260.

The power consumption state value data extracting unit 260 is a processing unit that extracts the data indicating the power consumption state value Y of the battery cell 410 to be managed from the power consumption state value data storage unit 240. The power consumption state value data extracting unit 260 receives data indicating a command to extract the data indicating the power consumption state value Y of the battery cell 410 to be managed from the request receiving unit 250, extracts the data indicating the power consumption state value Y of the battery cell 410 to be managed from the power consumption state value data storage unit 240, and transmits the extracted data to the power consumption state value data output unit 270.

The power consumption state value data output unit 270 is a processing unit that outputs the data indicating the power consumption state value Y of the battery cell 410 to be managed. The power consumption state value data output unit 270 receives the data indicating the power consumption state value Y of the battery cell 410 to be managed from the power consumption state value data extracting unit 260 and outputs the received data to the output device 800. The request receiving unit 250, the power consumption state value data extracting unit 260, and the power consumption state value data output unit 270 may also be provided in the BMU.

The balance circuit control unit 280 is a processing unit that controls the operation of the switch 450 of the balance circuit provided in the battery cell 410 to be managed. The balance circuit control unit 280 receives data indicating a command to start the balance circuit from the balance circuit control command unit 330 of the BMU 300 through the bus L5, turns on the switch 450 of the balance circuit provided in the battery cell 410 to be managed, and starts the balance circuit.

The switching control unit 290 is a processing unit that controls the operation of the switching unit 203 of another CMU 200 connected to the CMU 200 to which the switching control unit 290 belongs. Since the CMU 200 is connected in series to another CMU 200, the CMU 200 sequentially transmits or receives the command signal from the BMU or data that is output from a memory, such as the power consumption state value data storage unit 240, or the parameter acquiring unit of the CMU in correspondence with the command signal. When receiving data, the CMU or the BMU transmits a response signal indicating that the data has been received. When there is no response within a predetermined period of time after the CMU 200 to which the switching control unit 290 belongs transmits data to another CMU 200 or when measured data to be transmitted is not transmitted within a predetermined period of time, the switching control unit 290 operates the switching unit 203 of another CMU 200 that does not transmit a response or data to switch the path of data in another CMU 200 that does not transmit a response from a general internal bus to an internal bus for a bypass.

Next, the functional structure of the BMU 300 shown in FIG. 7 will be described with reference to a portion of the functional structure of the CMU 200 shown in FIG. 6.

The BMU 300 includes the common parameter acquiring unit 310, the inter-terminal voltage balance determining unit 320, the balance circuit control command unit 330, and the switching control unit 340. The common parameter acquiring unit 310 includes the total input/output current amount acquiring unit 311 and the start time acquiring unit 312.

The total input/output current amount acquiring unit 311 is a processing unit that acquires the amount of current input to the assembled battery 400 and the amount of current output from the assembled battery 400 after the assembled battery 400 is initially used. The total input/output current amount acquiring unit 311 receives data indicating the current value measured by the ammeter 600 and transmits the received data to the low current mode information acquiring unit 215 of the CMU 200 and the high current mode information acquiring unit 216 of the CMU 200 through the buses L1 and L2, respectively. In addition, the total input/output current amount acquiring unit 311 integrates the absolute value of the current value indicated by the data received from the ammeter 600 and transmits data indicating the integrated value to the power consumption state value calculating unit 230 of the CMU 200 through the bus L4.

The start time acquiring unit 312 is a processing unit that acquires the start time of the power load 500 after the power load 500 receives power from the assembled battery 400. The start time acquiring unit 312 receives data indicating that the power load 500 starts and data indicating the power load 500 stops from the system that manages the power load 500. Then, the start time acquiring unit 312 calculates the start time of the power load 500 after the power load 500 receives power from the assembled battery 400 and transmits data indicating the calculated time to the power consumption state value calculating unit 230 of the CMU 200 through the bus L4.

The inter-terminal voltage balance determining unit 320 is a processing unit that determines whether the balance of the inter-terminal voltage of each battery cell 410 is maintained. The inter-terminal voltage balance determining unit 320 receives data indicating the inter-terminal voltage value of the battery cell 410 to be managed together with data indicating the connection order of the battery cell 410 from the inter-terminal voltage value acquiring unit 213 of each CMU 200 through the bus L3. Then, when the balance of the inter-terminal voltage value indicated by the data received from the inter-terminal voltage value acquiring unit 213 of each CMU 200 is not maintained, the inter-terminal voltage balance determining unit 320 specifies the battery cell 410 with a high inter-terminal voltage value and transmits data indicating the connection order of the battery cell 410 to the balance circuit control command unit 330.

The balance circuit control command unit 330 is a processing unit that instructs the CMU 200 which manages the battery cell 410 with an inter-terminal voltage value higher than that of other battery cells to operate the balance circuit provided in the battery cell 410 to be managed. The balance circuit control command unit 330 receives data indicating the connection order of the battery cell 410 with a high inter-terminal voltage value from the inter-terminal voltage balance determining unit 320 and transmits data indicating a command to operate the balance circuit provided in the battery cell 410 to be managed to the balance circuit control unit 280 of the CMU 200 which manages the battery cell 410 through the bus L5.

The switching control unit 340 is a processing unit that controls the operation of the switching unit 203 of the CMU 200 which is directly connected to the BMU 300. When there is no response within a predetermined period of time after the transmission of data to the connected CMU 200, the switching control unit 340 transmits a switching signal for operating the switching unit 203 of the CMU 200 through the bus to switch the path of data in the CMU 200 from the general internal bus to the internal bus for a bypass.

Figure 9:
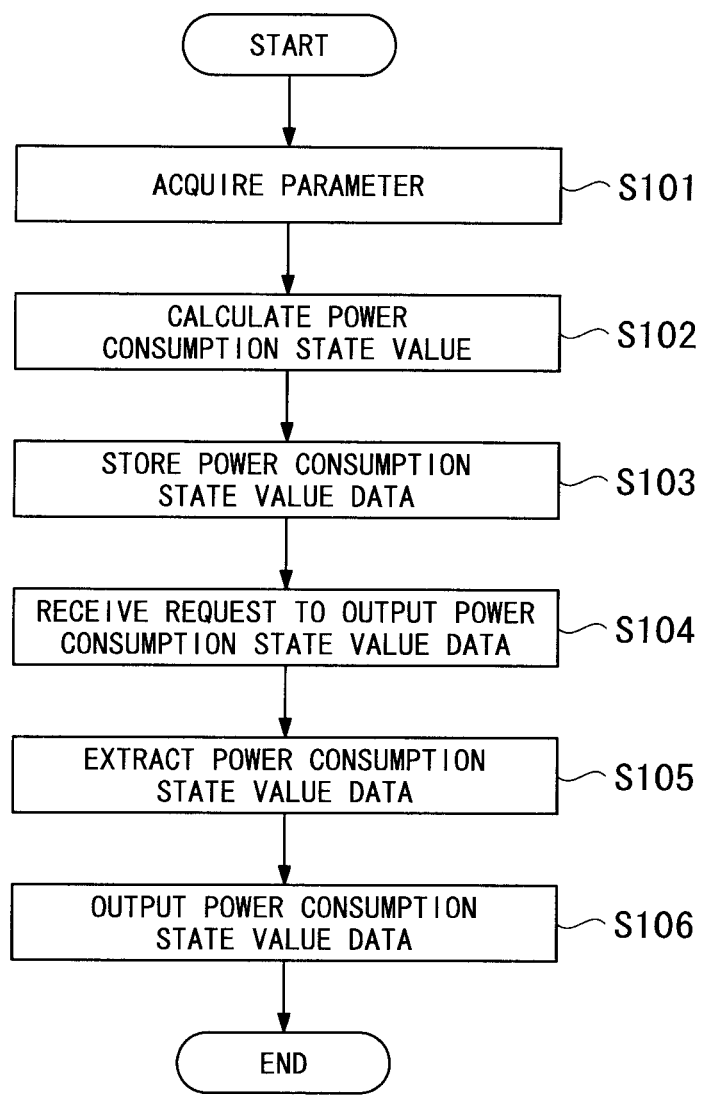
FIG. 9 is a diagram illustrating an example of the flow of a process of managing the power consumption state of the battery cell 410.

FIG. 9 is a diagram illustrating an example of the flow of a process of managing the power consumption of the battery cell 410.

First, the intrinsic parameter acquiring unit 210 of the CMU 200 and the common parameter acquiring unit 310 of the BMU 300 acquire parameters, which are power consumption factors of the battery cell 410 (S101). Specifically, the intrinsic parameter acquiring unit 210 and the common parameter acquiring unit 310 of the BMU 300 acquire data indicating the total input/output current amount Q, the start time T, the low current condition number $N_L$, the high current condition number $N_H$, and the temperature deterioration condition number $T_H$.

Then, the power consumption state value calculating unit 230 of the CMU 200 calculates the power consumption state value Y, which is a value indicating the degree of power consumption of the battery cell 410, for each battery cell 410 on the basis of the parameters acquired by the intrinsic parameter acquiring unit 210 of the CMU 200 and the common parameter acquiring unit 310 of the BMU 300 (S102). Specifically, the power consumption state value calculating unit 230 multiplies each parameter by a predetermined weighting coefficient and adds the calculated values. In this embodiment, for example, the parameter that causes the power consumption of the battery cell 410 to be reduced at a high rate when the acquired value of the parameter increases is multiplied by a large weighting coefficient. The weighting coefficient is a predetermined constant and is stored in the power consumption state value calculating unit 230.

For example, when weighting coefficients corresponding to the total input/output current amount Q, start time T, the low current condition number $N_L$, the high current condition number $N_H$, and the temperature deterioration condition number $T_H$ are a to e, the power consumption state value Y calculated by the power consumption state value calculating unit 230 is as follows: $Y = a \cdot Q + b \cdot T + c \cdot N_L + d \cdot N_H + e \cdot T_H$.

In this example, the power consumption state value Y of the battery cell 410 is calculated on the basis of five parameters. However, all of the parameters are not necessarily required. For example, as another embodiment, some of the parameters may be used to calculate the power consumption state value of the battery cell 410. When two or more parameters are used, it is possible to calculate the power consumption state value Y considering various points of view. For example, it is possible to increase the degree of importance of the parameters as a reference value when a used battery cell is reused.

Parameters other than the above-mentioned parameters may be added. For example, the case voltage of the battery cell 410 may be added as a parameter. When the positive terminal 411 and the case body 414 are connected to each other with a resistor interposed therebetween such that the case body 414 is not melted, the case body 414 is pulled up to positive potential. However, when a minute hole is formed in the case body 414 and liquid leaks through the hole, the case voltage varies. Therefore, the case voltage is useful as a factor for calculating the power consumption state value Y.

The data indicating the power consumption state value Y of the battery cell 410 to be managed, which is calculated by the power consumption state value calculating unit 230, is stored in the power consumption state value data storage unit 240 (S103).

When maintaining or discarding the assembled battery 400 including a plurality of battery cells 410, the following process is performed in order to check the power consumption state of each battery cell 410.

First, the request receiving unit 250 receives a request to output the power consumption state value data stored in the power consumption state value data storage unit 240 from the user (S104). Specifically, the request receiving unit 250 receives the request from the user through the external input device 700. For example, the user may input a desired power consumption state value and require the output of information of the battery cell with a power consumption state value larger than the desired power consumption state value. In addition, the user may input the connection order, which will be described below, and require the output of the power consumption state value data stored in the CMU corresponding to the battery cell in a desired connection order.

Then, the power consumption state value data extracting unit 260 of the CMU 200 extracts the power consumption state value data from the power consumption state value data storage unit 240 on the basis of the request received by the request receiving unit 250 (S105). Then, the power consumption state value data output unit 270 of the CMU 200 outputs the power consumption state value data extracted by the power consumption state value data extracting unit 260 to the external output device 800 (S106). Data indicating the output power consumption state value Y may be the power consumption state value Y. Further, the ratio of the power consumption state value of the current battery cell 410 to the power consumption state value of the unused battery cell 410 may be output as the degree of power consumption of the battery cell 410 in order to make it easy to objectively determine the power consumption state. When the power consumption state value data of a plurality of battery cells 410 is output, a list of the power consumption state value data of the battery cells 410 or a graph illustrating the power consumption state value data of the battery cells 410 may be output.

As such, according to the above-mentioned structure, the user can refer to data indicating the power consumption state value Y of each battery cell 410 at any time. Therefore, when the user maintains the battery system provided with the assembled battery 400 including a plurality of battery cells 410, for example, an electric vehicle or an electric train, the user can refer to the power consumption state of each battery cell 410 to replace only the battery cell 410 at a low power level or to reuse the battery cell 410 at a relatively high power level when the assembled battery 400 is discarded.

Figure 10:
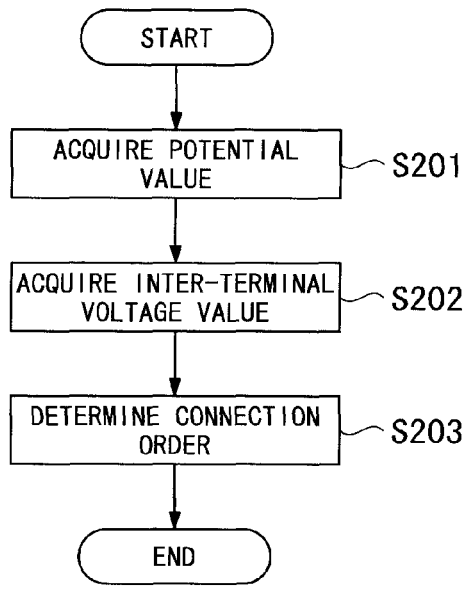
FIG. 10 is a diagram illustrating an example of the flow of a process of managing the connection order of the battery cell 410.

FIG. 10 is a diagram illustrating an example of the flow of a process of managing the connection order of the battery cells 410.

First, the potential value acquiring unit 212 of the CMU 200 acquires the potential value of the positive terminal 411 of the battery cell 410 with respect to the reference potential in the initial state in which the assembled battery 400 is incorporated into the system, for example, when the assembled battery 400 is incorporated into an electric vehicle as the system and starts up at the beginning (S201). Specifically, the potential value acquiring unit 212 acquires the potential value of the positive terminal 411 of the battery cell 410 to be monitored with respect to the reference potential from the voltage detecting unit 211.

Then, the inter-terminal voltage value acquiring unit 213 of the CMU 200 acquires the inter-terminal voltage value of the battery cell 410 (S202). Specifically, the inter-terminal voltage value acquiring unit 213 acquires the inter-terminal voltage value of the battery cell 410 to be monitored from the voltage detecting circuit 420 provided in the battery cell 410 to be monitored.

Then, the connection order calculating unit 220 of the CMU 200 calculates a connection order value indicating the connection order of the battery cell 410 to be monitored on the basis of the potential value acquired by the potential value acquiring unit 212 and the inter-terminal voltage value acquired by the inter-terminal voltage value acquiring unit 213 (S203). As described above, the battery cells 410 of the assembled battery 400 are connected in series. The connection order value of the battery cell 410 calculated by the connection order calculating unit 220 indicates the figure for the position of the battery cell 410 to be monitored from the reference potential among the plurality of battery cells 410 connected in series.

For example, when the inter-terminal voltage value of each battery cell 410 is v, the potential value of the positive terminal 411 with respect to the reference potential is nv in an n-th battery cell 410 from the reference potential among the plurality of battery cells 410 connected in series. Therefore, nv (potential value)/v (inter-terminal voltage)=n is established, and it is determined that the battery cell 410 is disposed in the n-th place from the reference potential among the plurality of battery cells 410 connected in series.

For example, when the inter-terminal voltage value of each battery cell 410 is 3 V, the potential value of the positive terminal 411 with respect to the reference potential is 3 V in the battery cell 410 closest to the reference potential. Therefore, 3 V (potential value)/3 V (inter-terminal voltage)=1 is established and it is determined that the battery cell 410 is disposed in the first place. Similarly, when the potential value of the positive terminal 411 is 6 V, 6 V (potential value)/3 V (inter-terminal voltage)=2 is established and it is determined that the battery cell 410 is disposed in the second place.

When a value obtained by dividing the potential of the positive terminal by the inter-terminal voltage between the positive and negative terminals is not an integer, for example, the value is rounded to the next whole number and the position of the battery cell may be determined.

The denominator of the division is the inter-terminal voltage of each battery cell, but it may be the average value of the inter-terminal voltages of the battery cells that are connected in series in the assembled battery. In this case, it is possible to round off variations in the inter-terminal voltage of each of the battery cells in the assembled battery and accurately calculate the connection order of the battery cell.

As described above, when there is no response from the process control unit 201 of another CMU 200 that has transmitted data, the process control unit 201 of the CMU 200 that does not respond is bypassed and is disconnected. This case does not occur in the initial state, but occurs after a predetermined amount of time has elapsed from the start-up of the system. In this case, each CMU 200 can also determine its own connection order in response to a request from the user, except the CMU that is out of order.

Therefore, the connection order calculated by each CMU 200 that is in a normal state is constant regardless of whether the process control unit 201 of the CMU 200 is out of order.

As such, in this embodiment, it is possible to automatically determine the connection order of each of a plurality of battery cells 410 which is connected in series from the reference potential. Then, the determined connection order is stored in the power consumption state value data storage unit so as to be associated with the power consumption state value data of each battery cell 410. Therefore, for example, it is possible to easily identify a battery cell among the battery cells 410 corresponding to the information of the power consumption state value data by recognizing only the information.

For example, in case that there is a voltage error in some of the battery cells of the assembled battery 400 after the assembled battery 400 is incorporated into an electric vehicle, an error occurs in determining the connection order. Therefore, in the initial state after the assembled battery 400 is incorporated, it is preferable to start the flow of the process of determining the connection order after the balance circuit starts and ends.

Figure 11:
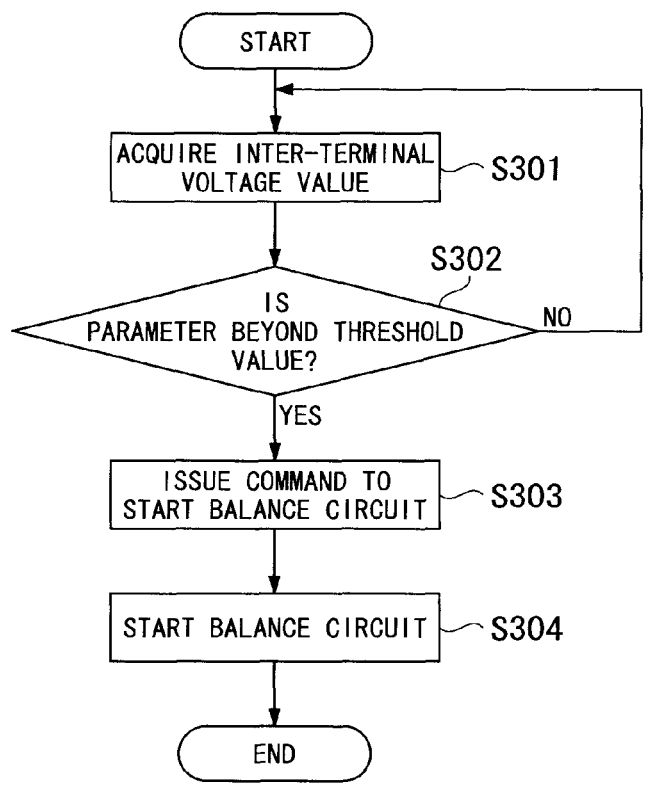
FIG. 11 is a diagram illustrating an example of the flow of a process of starting a balance circuit provided in the battery cell 410.

FIG. 11 is a diagram illustrating an example of the flow of a process of starting the balance circuit provided in the battery cell 410.

As described above, the inter-terminal voltage value acquiring unit 213 of the CMU 200 acquires the inter-terminal voltage value of the battery cell 410 to be managed (S301). Then, the inter-terminal voltage value acquiring unit 213 periodically transmits data indicating the acquired inter-terminal voltage value and data indicating the connection order of the battery cell 410 to be managed to the inter-terminal voltage balance determining unit 320 of the BMU 300.

Then, the inter-terminal voltage balance determining unit 320 of the BMU 300 determines whether the inter-terminal voltage of each battery cell 410 is balanced (S302). For example, the inter-terminal voltage balance determining unit 320 compares the inter-terminal voltage values of the battery cells 410 indicated by data received from the inter-terminal voltage acquiring unit 213 of each CMU 200. When there is the difference between the inter-terminal voltage values, the inter-terminal voltage balance determining unit 320 specifies the battery cell 410 with a high inter-terminal voltage value. In this case, when the difference is less than a predetermined allowable value, the inter-terminal voltage balance determining unit 320 determines that the balance is maintained. Then, the inter-terminal voltage balance determining unit 320 transmits data indicating the connection order of the battery cell 410 to the balance circuit control command unit 330.

When the inter-terminal voltage balance determining unit 320 determines that the battery cells 410 are not balanced (S302: Yes), the balance circuit control command unit 330 of the BMU 300 receives data indicating the connection order of the battery cell 410 with a high inter-terminal voltage value and instructs the switching control unit 290 of the CMU 200 that monitors the battery cell 410 to start the balance circuit (S303), otherwise S302: NO) the inter-terminal voltage value of the battery to be managed is once again acquired (S301).

Then, the balance circuit control unit 280 of the CMU 200 that receives the command to start the balance circuit from the balance circuit control command unit 330 of the BMU 300 starts the balance circuit provided in the battery cell 410 to be managed (S304). Specifically, the balance circuit control unit 280 turns on the switch 450 of the balance circuit which is provided in the battery cell 410 to be managed. In this way, after the balance circuit provided in the battery cell 410 to be managed starts, the inter-terminal voltage value acquiring unit 213 of the CMU 200 resumes acquiring the inter-terminal voltage value of the battery cell 410 to be managed.

Next, modifications of this embodiment will be described. In the battery cell state management system 100 according to this embodiment, the power consumption state value calculating unit 230 of each CMU 200 calculates a value indicating the degree of power consumption of the battery cell 410 to be managed. However, the BMU 300 may calculate the value. In this case, each CMU 200 transmits data required to calculate the value indicating the degree of power consumption of the battery cell 410 to be managed to the BMU 300. Then, each CMU 200 receives the data of the value indicating the degree of power consumption of the battery cell 410 to be managed from the BMU 300 and stores the received data in the power consumption state value data storage unit 240.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

According to the embodiment, in the assembled battery including a plurality of battery cells connected in series, it is possible to acquire each power consumption parameter from each of the battery cells and manage data indicting the power consumption state of each battery cell calculated on the basis of each parameter. In this way, according to the system of the invention, when the assembled battery is reused or maintained, it is possible to easily check the power consumption state of each battery cell and select the reuse or discard of each battery cell.

While the exemplary embodiments of the invention have been described with reference to the accompanying drawings, the detailed constitutions of the invention are not limited to the foregoing embodiments but embrace changes in design to the extent that they do not depart from the concept of the invention.

What is claimed is:
1. A battery system comprising:
   a first battery cell; and
   a first management unit which is connected in one-to-one correspondence to the first battery cell,
      wherein the first management unit at least includes:

a first parameter acquiring unit which acquires a power consumption parameter of the first battery cell;

a first calculating unit which calculates a power consumption state value of the first battery cell on the basis of the power consumption parameter acquired by the first parameter acquiring unit;

a first storage unit which stores the power consumption state value calculated by the first calculating unit;

a power load which moves by electric power supplied from the first battery cell; and a start time acquiring unit which times start time of the power load, wherein the first calculating unit which calculates the power consumption state value using at least two power consumption parameters among temperature of the first battery cell, a current value input to the first battery cell, a current value output from the first battery cell, and operating time of the power load, as power consumption parameters.

2. The battery system according to claim 1, wherein the power load is an electric motor, and wherein the battery system is one of an industrial vehicle, an electric vehicle, a hybrid vehicle, and an electric train, which uses the electric motor.

3. The battery system according to claim 1, further comprising:

a second battery cell which is connected in series to the first battery cell; and a second management unit which is connected in one-to-one correspondence to the second battery cell, wherein the first management unit further comprises:

a first voltage detecting unit which detects a potential of a positive terminal and a voltage between the positive terminal and a negative terminal of the first battery cell; and a first connection order calculating unit which calculates a connection order of the first battery cell by doing division with the potential of the positive terminal and the voltage between the positive terminal and the negative terminal, wherein the second management unit comprises:

a second parameter acquiring unit which acquires a power consumption parameter of the second battery cell;

a second calculating unit which calculates a power consumption state value of the second battery cell on the basis of the power consumption parameter acquired by the second parameter acquiring unit;

a second storage unit which stores the power consumption state value calculated by the second calculating unit;

a second voltage detecting unit which detects the potential of the positive terminal and a voltage between a positive terminal and a negative terminal of the second battery cell; and a second connection order calculating unit which calculates a connection order of the second battery cell by doing division with the potential of the positive terminal and the voltage between the positive terminal and the negative terminal, wherein the connection order calculated by the first connection order calculating unit is stored in the first storage unit so as to be associated with the power consumption state value of the first battery cell stored in the first storage unit, and the connection order calculated by the second connection order calculating unit is stored in the second storage unit so as to be associated with the power consumption state value of the second battery cell stored in the second storage unit.

4. The battery system according to claim 3, further comprising:

a third management unit which is connected to the second management unit by a second bus, wherein the first and the second management units are connected to each other by a first bus, wherein the second management unit comprises:

an internal bus; and a switching unit which alternatively selects a non-bypass path, which electrically connects the second parameter acquiring unit, the second calculating unit, the second storage unit, the second voltage detecting unit, and the second connection order calculating unit to the first and the second buses, or a bypass path which electrically disconnects the second parameter acquiring unit, the second calculating unit, the second storage unit, the second voltage detecting unit, and the second connection order calculating unit from the first and the second buses and connects the first and the second buses to the internal bus, wherein the first or the third management unit comprises a switching control unit which determines whether a predetermined signal is output from the second management unit to the first or the second bus, wherein when it is determined that the predetermined signal is not output, the switching control unit transmits a switching signal to the switching unit through the first or the second bus, and wherein the switching unit switches the path from the non-bypass path to the bypass path.

5. The battery system according to claim 1, further comprising: an input device which inputs a command to read out the power consumption state value of the first battery cell from the first storage unit; and an output device which displays the power consumption state value which the first storage unit has output by the command.

6. The battery system according to claim 5, further comprising:

a second battery cell which is connected in series to the first battery cell; and a second management unit which is connected in one-to-one correspondence to the second battery cell, wherein the first management unit further comprises:

a first voltage detecting unit which detects a potential of a positive terminal and a voltage between the positive terminal and a negative terminal of the first battery cell; and a first connection order calculating unit which calculates a connection order of the first battery cell by doing division with the potential of the positive terminal and the voltage between the positive terminal and the negative terminal, wherein the second management unit comprises:

a second parameter acquiring unit which acquires a power consumption parameter of the second battery cell;

a second calculating unit which calculates a power consumption state value of the second battery cell on the basis of the power consumption parameter acquired by the second parameter acquiring unit;

a second storage unit which stores the power consumption state value calculated by the second calculating unit;

a second voltage detecting unit which detects the potential of the positive terminal and a voltage between a positive terminal and a negative terminal of the second battery cell; and a second connection order calculating unit which calculates a connection order of the second battery cell by doing division with the potential of the positive terminal and the voltage between the positive terminal and the negative terminal, wherein the connection order calculated by the first connection order calculating unit is stored in the first storage unit so as to be associated with the power consumption state value of the first battery cell stored in the first storage unit, and the connection order calculated by the second connection order calculating unit is stored in the second storage unit so as to be associated with the power consumption state value of the second battery cell stored in the second storage unit.

7. The battery system according to claim 6, further comprising:

a third management unit which is connected to the second management unit by a second bus, wherein the first and the second management units are connected to each other by a first bus, wherein the second management unit comprises:

an internal bus; and a switching unit which alternatively selects a non-bypass path, which electrically connects the second parameter acquiring unit, the second calculating unit, the second storage unit, the second voltage detecting unit, and the second connection order calculating unit to the first and the second buses, or a bypass path which electrically disconnects the second parameter acquiring unit, the second calculating unit, the second storage unit, the second voltage detecting unit, and the second connection order calculating unit from the first and the second buses and connects the first and the second buses to the internal bus, wherein the first or the third management unit comprises a switching control unit which determines whether a predetermined signal is output from the second management unit to the first or the second bus, wherein when it is determined that the predetermined signal is not output, the switching control unit transmits a switching signal to the switching unit through the first or the second bus, and wherein the switching unit switches the path from the non-bypass path to the bypass path.

8. The battery system according to claim 7, wherein the power load is an electric motor, and wherein the battery system is one of an industrial vehicle, an electric vehicle, a hybrid vehicle, and an electric train, which uses the electric motor.

9. The battery system according to claim 1, further comprising an upper cover and a lower cover which are made of an insulating material, wherein the upper cover comprises input-output connectors, wherein the lower cover comprises the first calculating unit and the first storage unit, and wherein the upper cover is placed with an upper part of the first battery cell having a positive terminal and a negative terminal which lie in the same plane as the positive terminal, and the lower cover is fitted to the upper cover as such the first battery cell is tuck down, so as to integrally form the first battery cell and the upper and lower covers, and electrically connect the input-output connectors to the first calculating unit and the first storage unit.

10. The battery system according to claim 9, further comprising:

an input device which inputs a command to read out the power consumption state value of the first battery cell from the first storage unit; and an output device which displays the power consumption state value which the first storage unit has output by the command.

11. The battery system according to claim 10, further comprising:

a second battery cell which is connected in series to the first battery cell; and a second management unit which is connected in one-to-one correspondence to the second battery cell, wherein the first management unit further comprises:

a first voltage detecting unit which detects a potential of a positive terminal and a voltage between the positive terminal and a negative terminal of the first battery cell; and a first connection order calculating unit which calculates a connection order of the first battery cell by doing division with the potential of the positive terminal and the voltage between the positive terminal and the negative terminal, wherein the second management unit comprises:

a second parameter acquiring unit which acquires a power consumption parameter of the second battery cell;

a second calculating unit which calculates a power consumption state value of the second battery cell on the basis of the power consumption parameter acquired by the second parameter acquiring unit;

a second storage unit which stores the power consumption state value calculated by the second calculating unit;

a second voltage detecting unit which detects the potential of the positive terminal and a voltage between a positive terminal and a negative terminal of the second battery cell; and a second connection order calculating unit which calculates a connection order of the second battery cell by doing division with the potential of the positive terminal and the voltage between the positive terminal and the negative terminal, wherein the connection order calculated by the first connection order calculating unit is stored in the first storage unit so as to be associated with the power consumption state value of the first battery cell stored in the first storage unit, and the connection order calculated by the second connection order calculating unit is stored in the second storage unit so as to be associated with the power consumption state value of the second battery cell stored in the second storage unit.

12. The battery system according to claim 11, further comprising:

a third management unit which is connected to the second management unit by a second bus, wherein the first and the second management units are connected to each other by a first bus, wherein the second management unit comprises:

an internal bus; and a switching unit which alternatively selects a non-bypass path, which electrically connects the second parameter acquiring unit, the second calculating unit, the second storage unit, the second voltage detecting unit, and the second connection order calculating unit to the first and the second buses, or a bypass path which electrically disconnects the second parameter acquiring unit, the second calculating unit, the second storage unit, the second voltage detecting unit, and the second connection order calculating unit from the first and the second buses and connects the first and the second buses to the internal bus, wherein the first or the third management unit comprises a switching control unit which determines whether a predetermined signal is output from the second management unit to the first or the second bus, wherein when it is determined that the predetermined signal is not output, the switching control unit transmits a switching signal to the switching unit through the first or the second bus, and wherein the switching unit switches the path from the non-bypass path to the bypass path.

13. The battery system according to claim 12, wherein the power load is an electric motor, and wherein the battery system is one of an industrial vehicle, an electric vehicle, a hybrid vehicle, and an electric train, which uses the electric motor.

\* \* \* \* \*